(12) United States Patent
Yerushalmi et al.

(10) Patent No.: US 12,131,959 B2
(45) Date of Patent: Oct. 29, 2024

(54) SYSTEMS AND METHODS FOR IMPROVED METROLOGY FOR SEMICONDUCTOR DEVICE WAFERS

(71) Applicant: KLA Corporation, Milpitas, CA (US)

(72) Inventors: Liran Yerushalmi, Zicron Yaacob (IL); Daria Negri, Haifa (IL); Ohad Bachar, Timrat (IL); Yossi Simon, Qiryat Atta (IL); Amnon Manassen, Haifa (IL); Nir Ben David, Hod Hasharon (IL); Yoram Uziel, Yodfat (IL); Etay Lavert, Givat Ella (IL)

(73) Assignee: KLA Corporation, Milpitas, CA (US)

( * ) Notice: Subject to any disclaimer, the term of this patent is extended or adjusted under 35 U.S.C. 154(b) by 487 days.

(21) Appl. No.: 17/469,280

(22) Filed: Sep. 8, 2021

(65) Prior Publication Data

US 2022/0344218 A1    Oct. 27, 2022

Related U.S. Application Data

(60) Provisional application No. 63/177,966, filed on Apr. 22, 2021.

(51) Int. Cl.
*H01L 21/66* (2006.01)
*G05B 19/418* (2006.01)

(52) U.S. Cl.
CPC ........ *H01L 22/12* (2013.01); *G05B 19/41875* (2013.01); *G05B 2219/45031* (2013.01)

(58) Field of Classification Search
CPC .............. H01L 22/12; G05B 19/41875; G05B 2219/45031
See application file for complete search history.

(56) References Cited

U.S. PATENT DOCUMENTS

| 7,608,468 B1 | 10/2009 | Ghinovker et al. |
| 7,680,616 B2 * | 3/2010 | Heiden ................ G01B 21/045 702/95 |

(Continued)

FOREIGN PATENT DOCUMENTS

| EP | 1570232 A1 | 9/2005 |
| JP | 4314082 B2 | 8/2009 |

(Continued)

OTHER PUBLICATIONS

WIPO, International Search Report for International Application No. PCT/US2021/053051, Jan. 21, 2022.

(Continued)

*Primary Examiner* — Zhipeng Wang
(74) *Attorney, Agent, or Firm* — Hodgson Russ LLP

(57) ABSTRACT

A system and method for generating a quality parameter value of a semiconductor device wafer (SDW), during fabrication thereof, the method including designating a plurality of measurement site sets (MSSs) on the SDW, each of the MSSs including a first measurement-orientation site (FMS) and a second measurement-orientation site (SMS), the FMS and the SMS being different measurement sites on the SDW, generating a first measurement-orientation quality parameter dataset (FMQPD) by measuring features formed within each the FMS of at least one of the MSSs in a first measurement orientation, generating a second measurement-orientation quality parameter dataset (SMQPD) by measuring features formed within each the SMS of the at least one of the MSSs in a second measurement orientation and generating at least one tool-induced-shift (TIS)-ameliorated quality parameter value (TAQPV), at least partially based on the FMQPD and the SMQPD.

24 Claims, 5 Drawing Sheets

(56) References Cited

U.S. PATENT DOCUMENTS

| | | |
|---|---|---|
| 7,804,994 B2 | 9/2010 | Adel et al. |
| 7,876,438 B2 | 1/2011 | Ghinovker et al. |
| 9,778,213 B2 | 10/2017 | Bakeman et al. |
| 9,927,718 B2 | 3/2018 | Kandel et al. |
| 10,527,951 B2 | 1/2020 | Yohanan et al. |
| 2003/0025895 A1 | 2/2003 | Binnard |
| 2011/0292365 A1 | 12/2011 | Cramer et al. |
| 2019/0122357 A1* | 4/2019 | Grunzweig ......... G03F 7/70633 |

FOREIGN PATENT DOCUMENTS

| | | |
|---|---|---|
| JP | 4971225 B2 | 7/2012 |
| WO | 2020167331 A1 | 8/2020 |
| WO | 2020197544 A1 | 10/2020 |
| WO | 2021054928 A1 | 3/2021 |

OTHER PUBLICATIONS

Klein et al., "Error modeling and accuracy breakdown in optical overlay metrology for advanced nodes", Proceedings of Optical Microlithography XXXIV, Feb. 22, 2021, pp. 116130X-1 to 116130X-8, vol. 11613, SPIE Digital Library.

Ophir et al., "Machine learning for Tool Induced Shift (TIS) reduction: an HVM case study", Proceedings of Metrology, Inspection, and Process Control for Semiconductor Manufacturing XXXV, Feb. 22, 2021, pp. 116110E-1 to 116110E-7, vol. 11611, SPIE Digital Library.

Ausschnitt et al., "Multilayer overlay metrology", Proceedings of Metrology, Inspection, and Process Control for Microlithography XX, pp. 615210-1 to 615210-10, vol. 6152, SPIE Digital Library.

* cited by examiner

SYSTEMS AND METHODS FOR IMPROVED METROLOGY FOR SEMICONDUCTOR DEVICE WAFERS

REFERENCE TO RELATED APPLICATIONS

Reference is hereby made to U.S. Provisional Patent Application Ser. No. 63/177,966, filed Apr. 22, 2021 and entitled TOOL INDUCED SHIFT (TIS) MAPPING AND REMOVAL BY ALTERNATE WAFER ORIENTATION AND DATA MODELING, the disclosure of which is hereby incorporated by reference and priority of which is hereby claimed.

Reference is also made to the following patents and patent applications of the Applicant, which are related to the subject matter of the present application, the disclosures of which are hereby incorporated by reference:

- U.S. Pat. No. 7,608,468 entitled APPARATUS AND METHODS FOR DETERMINING OVERLAY AND USES OF SAME;
- U.S. Pat. No. 7,804,994 entitled OVERLAY METROLOGY AND CONTROL METHOD;
- U.S. Pat. No. 7,876,438 entitled APPARATUS AND METHODS FOR DETERMINING OVERLAY AND USES OF SAME;
- U.S. Pat. No. 9,778,213 entitled METROLOGY TOOL WITH COMBINED XRF AND SAXS CAPABILITIES;
- U.S. Pat. No. 9,927,718 entitled MULTI-LAYER OVERLAY METROLOGY TARGET AND COMPLIMENTARY OVERLAY METROLOGY MEASUREMENT SYSTEMS;
- U.S. Pat. No. 10,527,951 entitled COMPOUND IMAGING METROLOGY TARGETS;
- European Patent No. 1,570,232 entitled APPARATUS AND METHODS FOR DETECTING OVERLAY ERRORS USING SCATTEROMETRY;
- PCT Application No. PCT/US2019/023918, filed Mar. 25, 2019, and entitled VACUUM HOLD-DOWN APPARATUS FOR FLATTENING BOWED SEMICONDUCTOR WAFERS;
- PCT Application No. PCT/US2019/035282, filed Jun. 4, 2019 and entitled MISREGISTRATION MEASUREMENTS USING COMBINED OPTICAL AND ELECTRON BEAM TECHNOLOGY; and
- PCT Application No. PCT/US2019/051209, filed Sep. 16, 2019 and entitled PERIODIC SEMICONDUCTOR DEVICE MISREGISTRATION METROLOGY SYSTEM AND METHOD.

FIELD OF THE DISCLOSURE

The present disclosure relates to measurement of quality metrics in the manufacture of semiconductor devices generally.

BACKGROUND OF THE DISCLOSURE

Various methods and systems are known for measurement of quality metrics in the manufacture of semiconductor devices.

SUMMARY OF THE DISCLOSURE

The present disclosure seeks to provide improved methods and systems for measurement of quality metrics in the manufacture of semiconductor devices.

There is thus provided in accordance with an embodiment of the present disclosure a method of generating a quality parameter value of a semiconductor device wafer (SDW), during fabrication thereof, the method including designating a plurality of measurement site sets (MSSs) on the SDW, each of the MSSs including a first measurement-orientation site (FMS) and a second measurement-orientation site (SMS), the FMS and the SMS being different measurement sites on the SDW, generating a first measurement-orientation quality parameter dataset (FMQPD) by measuring features formed within each the FMS of at least one of the MSSs in a first measurement orientation, generating a second measurement-orientation quality parameter dataset (SMQPD) by measuring features formed within each the SMS of the at least one of the MSSs in a second measurement orientation and generating at least one tool-induced-shift (TIS)-ameliorated quality parameter value (TAQPV), at least partially based on the FMQPD and the SMQPD.

In accordance with an embodiment of the present disclosure, the first measurement orientation and the second measurement orientation each include a rotational orientation within a plane generally parallel to an upper surface of the SDW. The first measurement orientation can be embodied as a rotational orientation of 0° within a plane generally parallel to an upper surface of the SDW, and the second measurement orientation is embodied as a rotational orientation of 180° within the plane generally parallel to the upper surface of the SDW.

In an embodiment of the present disclosure, the quality parameter is a misregistration between at least a first layer formed on the SDW and a second layer formed on the SDW. Additionally or alternatively, the quality parameter is a dimension of at least one of the features. Additionally or alternatively, the quality parameter is a dimension of at least one space between the features.

In accordance with an embodiment of the present disclosure, each of the at least one TAQPV is associated with one of the FMSs or SMSs. Alternatively, in accordance with an embodiment of the present disclosure, each of the at least one TAQPV is associated with one of the MSSs. Alternatively, in accordance with an embodiment of the present disclosure, each of the at least one TAQPV is associated with a group of the MSSs.

In an embodiment of the present disclosure, the TAQPV is used to adjust at least one parameter of the fabrication of the SDW.

The features can be formed within each the FMS of the at least one of the MSSs are intended to be identical to the features formed within each the SMS of the at least one of the MSSs.

In accordance with an embodiment of the present disclosure, the features formed within the FMS include a misregistration target and the features formed within the SMS include a misregistration target. Additionally or alternatively, in accordance with an embodiment of the present disclosure, the features formed within the FMS include functional semiconductor devices and the features formed within the SMS include functional semiconductor devices.

The generating of the at least one TAQPV can include fitting the FMQPD and the SMQPD to a model.

There is also provided in accordance with another embodiment of the present disclosure a system for generating a quality parameter value of a semiconductor device wafer (SDW), the system including a measurement site set designator (MSSD), operative to designate a plurality of measurement site sets (MSSs) on the SDW, each of the MSSs including a first measurement-orientation site (FMS), and a second-orientation measurement site (SMS), the FMS and the SMS being different measurement sites on the SDW, a metrology tool, operative to measure features formed within each the FMSs of each of the MSSs in a first measurement orientation, thereby generating a first measurement-orientation quality parameter dataset (FMQPD), and measure features formed within each the SMSs of each of the MSSs in a second measurement orientation, thereby generating a second measurement-orientation quality parameter dataset (SMQPD), and a quality parameter analyzer, operative to generate at least one tool-induced-shift (TIS)-ameliorated quality parameter value (TAQPV), at least partially based on the FMQPD and the SMQPD.

BRIEF DESCRIPTION OF THE DRAWINGS

The present disclosure will be understood and appreciated more fully from the following detailed description, taken in conjunction with the drawings in which.

DETAILED DESCRIPTION OF THE DISCLOSURE

It is appreciated that the system and method described hereinbelow with reference to FIGS. 1-3B can be used to measure semiconductor devices and generate quality metrics therefor, such as indications of misregistration between different layers of semiconductor devices, and are part of a manufacturing process for semiconductor devices. The quality metrics generated by the system and method described hereinbelow with reference to FIGS. 1-3B can be used to adjust fabrication processes, such as lithography, during the manufacturing of semiconductor devices, to ameliorate the semiconductor devices being fabricated, for example, to ameliorate misregistration between various layers of semiconductor devices.

In order to maintain desired characteristics of structures formed on a semiconductor device wafer, including the spatial registration of the various layers of the semiconductor devices being formed thereon, quality metrics, such as misregistration between structures formed on the semiconductor device wafer, are typically measured multiple times throughout a fabrication process of the semiconductor devices. Signals used to calculate misregistration values typically include both desired data, which accurately represents misregistration, and noise, such as tool-induced-shift (TIS) error, particularly TIS error that is due to poor telecentricity associated with the measurement or to irregularities, such as asymmetry, of features being measured.

In order to improve the quality and utility of the metrology measurements, a portion of the misregistration signal which is due to TIS error can be identified and removed. Conventional systems typically identify TIS error at a multiplicity of measurement sites by measuring each site twice, with a first measurement being taken while the measurement site is at a first rotational orientation within an x-y plane, the x-y plane being generally parallel to an upper surface of the semiconductor device wafer, and the second measurement being taken while the measurement site is at a second rotational orientation within the x-y plane. For example, each site may be measured a first time while the site has a rotational orientation in an x-y plane of 0°, and then each site may be measured a second time while the site has a rotational orientation in an x-y plane of 180°. A difference between the two measurements at two different rotational orientations is taken to be the TIS error, and is removed from the misregistration value reported for that site.

Taking multiple measurements is typically a time-consuming process that impacts fabrication throughput, reducing a number of semiconductor devices that can be fabricated in a given amount of time. Therefore, reducing a number of measurements with minimal impact on the accuracy of the measurements is advantageous, particularly as a way to minimize an impact of the metrology measurement on fabrication throughput.

Figure 1:
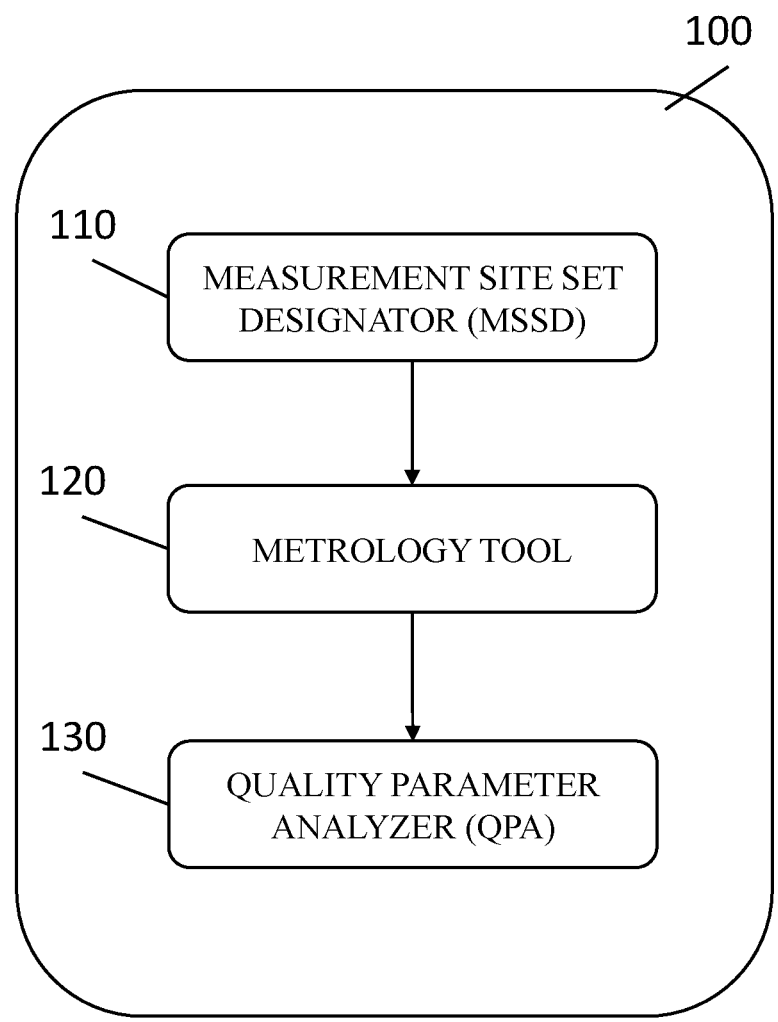
FIG. 1 is a simplified schematic diagram of an embodiment of a metrology system of the present disclosure.
Figure 2:
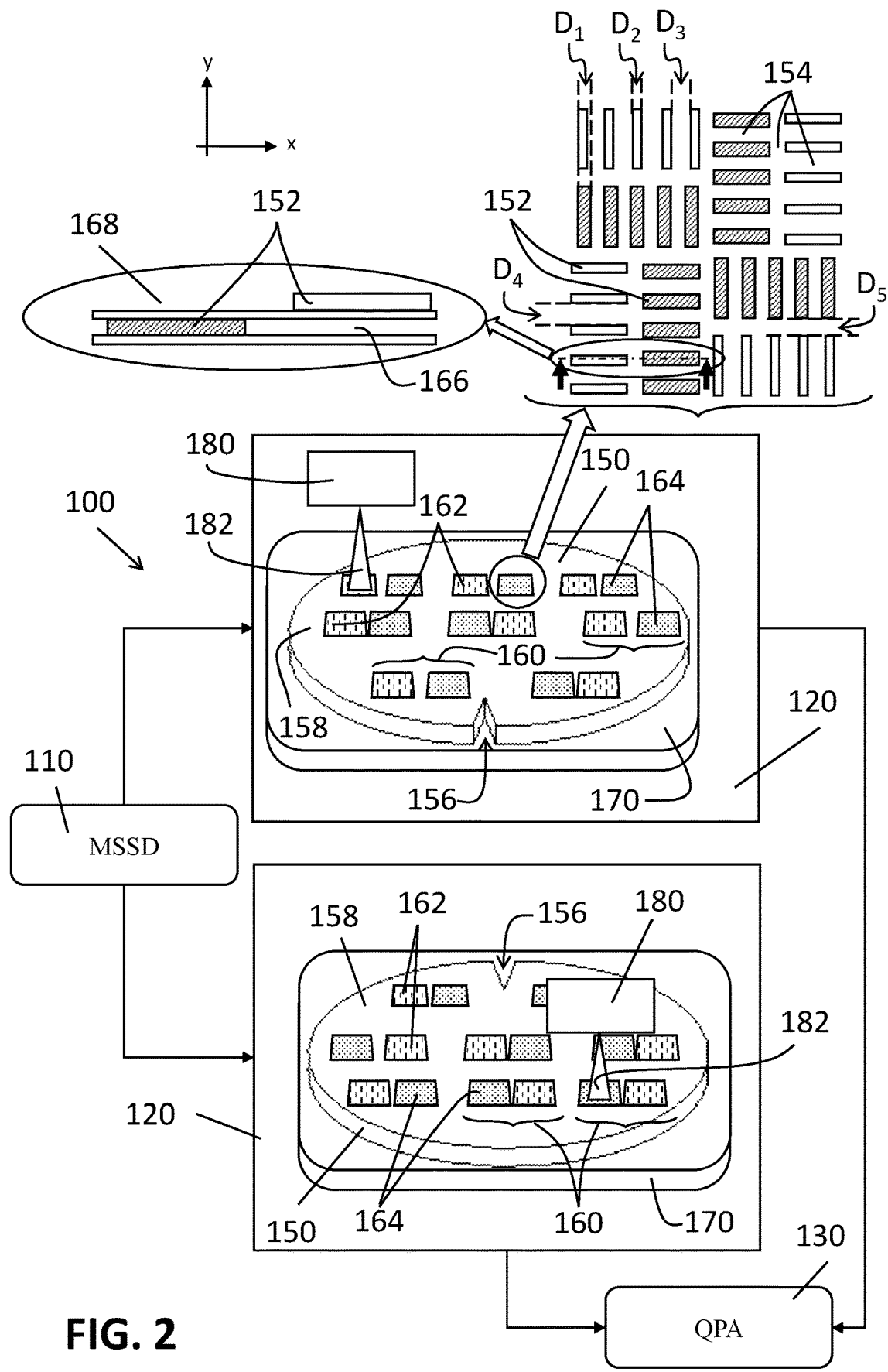
FIG. 2 is a simplified schematic diagram showing an exemplary use case of the metrology system of FIG. 1.

Reference is now made to FIG. 1, which is a simplified schematic diagram of an embodiment of a metrology system 100 of the present disclosure, and to FIG. 2, which is a simplified schematic diagram showing an exemplary use case of metrology system 100. It is appreciated that, for ease of understanding, FIGS. 1 & 2 are not drawn to scale.

As seen in FIGS. 1 & 2, system 100 can include a measurement site set designator (MSSD) 110, a metrology tool 120 and a quality parameter analyzer (QPA) 130. It is appreciated that while in FIGS. 1 & 2, MSSD 110 and QPA 130 are drawn as separate from metrology tool 120, in an alternative embodiment of the present disclosure, at least one of MSSD 110 and QPA 130 are included in metrology tool 120. It is further appreciated that while metrology tool 120 is shown twice in FIG. 2, FIG. 2 is intended to show two different operative orientations of a single metrology tool 120.

MSSD 110 and QPA 130 typically include a programmable processor, which is programmed in software and/or firmware to carry out the functions that are described herein, along with suitable digital and/or analog interfaces for connection to the other elements of system 100. Alternatively or additionally, MSSD 110 or QPA 130 can include hard-wired and/or programmable hardware logic circuits, which carry out at least some of the functions of the MSSD 110 or QPA 130. Although the MSSD 110 and QPA 130 are shown in FIG. 1, for the sake of simplicity, as monolithic functional blocks, in practice these may comprise a single unit or additional interconnected control units, with suitable interfaces for receiving and outputting the signals that are illustrated in the figures and described in the text. Program code or instructions for the MSSD 110 and QPA 130 to implement various methods and functions disclosed herein may be stored in readable storage media, such as a memory.

Metrology tool 120 may be any suitable metrology tool, including, inter alia, an imaging-based misregistration metrology tool, a scatterometry-based misregistration metrology tool, a critical dimension metrology tool, a shape metrology tool, a film metrology tool, an electron-beam metrology tool and an X-ray imaging tool, such as a layer-to-layer x-ray metrology tool. Exemplary metrology tools suitable for use as metrology tool 120 include, inter alia, an Archer™ 750, an ATL™ 100, a SpectraShape™ 11k, a SpectraFilm™ F1 and an eDR7380™ all of which are commercially available from KLA Corporation of Milpitas, CA, USA. An additional exemplary metrology tool suitable for use as metrology tool 120 is an x-ray tool similar to the x-ray tool described in U.S. Pat. No. 9,778,213.

Metrology tool 120 can be operative to measure a quality metric of a sample, which can be embodied as a semiconductor device wafer (SDW) 150, such as a misregistration between at least two layers formed on SDW, a dimension of one or more features 152 formed on SDW 150 or a dimension of one or more spaces 154 between features 152 formed on SDW 150.

SDW 150 is typically generally disc-like in shape, and can include a positioning feature 156, such as a notch or a flattened portion. Positioning feature 156 is useful in identifying a rotational orientation of SDW 150 within a plane generally parallel to an upper surface 158 of SDW 150.

MSSD 110 can designate a plurality of measurement site sets (MSSs) 160 on SDW 150, each MSS 160 including a first measurement-orientation site (FMS) 162, and a second measurement-orientation site (SMS) 164. It is appreciated that FMS 162 and SMS 164 are different measurement sites on SDW 150, and thus measurements of each of FMS 162 and SMS 164 measure different ones of features 152. In some embodiments of the present disclosure (not shown), each MSS 160 includes at least one additional measurement-orientation site. It is appreciated that FMS 162 and SMS 164 of a single MSS 160 can be adjacent to one another, but need not be.

It is further appreciated that each FMS 162 and SMS 164 on SDW 150 may have any suitable shape and dimension. Similarly, SDW 150 may have any suitable number of MSSs 160 having any suitable distribution thereupon. In one embodiment of the present disclosure, at least some of features 152 within FMS 162 and SMS 164 of each MSS 160 are intended to be identical or nearly identical to features within FMS 162 and SMS 164 of other MSSs 160. In another embodiment of the present disclosure, at least some of features 152 within FMS 162 and SMS 164 of each MSS 160 intentionally differ from features 152 within FMS 162 and SMS 164 of other MSSs 160. However, features 152 within FMS 162 of a particular MSS 160 may be intended to be identical or nearly identical to features 152 within SMS 164 of that particular MSS 160. Similarly, in an embodiment wherein MSSs 160 include at least one additional measurement-orientation site, features 152 within FMS 162 of a particular MSS 160 may be intended to be identical or nearly identical to features 152 within each additional measurement-orientation site of that particular MSS 160.

Features 152 in FMS 162 and SMS 164 may be formed with a single layer formed on SDW 150 or with multiple layers formed on SDW 150. For example, in the example shown in FIG. 2, each FMS 162 and SMS 164 includes both features 152 formed together with a first layer 166 formed on SDW 150 and features 152 formed together with a second layer 168 formed on SDW 150. Features on semiconductor device wafers are typically characterized by a smallest dimension thereof in an x-y plane, as indicated by x- and y-axes, such as dimensions $D_1$ and $D_2$ of features 152 indicated in FIG. 2. Similarly, spaces between features on semiconductor device wafers are typically characterized by a smallest dimension thereof in the x-y plane, such as dimensions $D_3$, $D_4$ and $D_5$ of spaces 154 indicated in FIG. 2.

For simplicity, FMS 162 and SMS 164 are shown in FIG. 2 as each including an advanced imaging metrology (AIM) target. However, features 152 within each of FMS 162 and SMS 164 may form any suitable misregistration target, such as, inter alia, a box-in-box target, such as a target similar to targets described in U.S. Pat. No. 7,804,994; an AIM in-die (AIMid) target, such as a target similar to targets described in U.S. Pat. No. 10,527,951; a blossom or micro-blossom target, such as a target similar to targets described in C. P. Ausschnitt, J. Morningstar, W. Muth, J. Schneider, R. J. Yerdon, L. A. Binns, N. P. Smith, "Multilayer overlay metrology," Proc. SPIE 6152, Metrology, Inspection, and Process Control for Microlithography XX, 615210 (24 Mar. 2006); a Moiré target, such as a target similar to targets described in U.S. Pat. No. 7,876,438; a target useful in diffraction based measurements, such as a target similar to targets described in European Patent No. 1,570,232; a target useful in electron-beam based measurements, such as a target similar to targets described in U.S. Pat. No. 7,608,468; a hybrid imaging-electron beam target or a hybrid scatterometry electron-beam target, similar to targets described in PCT Application No. PCT/US2019/035282; and a target useful in measuring misregistration between three or more layers, such as a target similar to targets described in U.S. Pat. No. 9,927,718. Additionally, features 152 formed within FMS 162 and SMS 164 may include complete or partial semiconductor devices intended to be functional semiconductor devices, such as, inter alia, those described in PCT Application No. PCT/US2019/051209.

As seen particularly in FIG. 2, metrology tool 120 is operative to measure features 152 formed within each FMS 162 of each MMS 160 in a first measurement orientation, and to measure features 152 formed within each SMS 164 of each MMS 160 in a second measurement orientation. It is appreciated that as used herein, "orientation" refers to a rotational orientation of SDW 150 within a plane generally parallel to upper surface 158 of SDW 150. The first and second measurement orientations may have any suitable values which are different from one another, most typically 0° and 180°, respectively. In one embodiment of the present disclosure, metrology tool 120 is operative to measure measurement sites on SDW 150 while SDW 150 is in at least one additional rotational orientation other than the first measurement orientation and the second measurement orientation.

Metrology tool 120 can include a chuck 170 which is rotatable in an x-y plane being generally parallel to upper surface 158 of SDW 150. Chuck 170 is operative to support and position a sample, such as SDW 150, being measured by metrology tool 120. Chuck 170 may be any suitable chuck, including, inter alia, a chuck such as is described in PCT Application No. PCT/US2019/023918. The measurement orientation of DWS 150 is determined by a position of chuck 170. SDW 150 can be fixedly mounted on chuck 170 during measurement, typically by a vacuum attachment, and a rotational orientation of SDW 150 in a plane generally parallel to upper surface 158 of SDW 150 is determined by a corresponding rotational orientation of chuck 170.

It is a particular feature of the present disclosure that while some of FMSs 162 and SMSs 164 may be measured in both the first measurement orientation and the second measurement orientation, most of FMSs 162 are measured only in the first orientation and most of SMSs 164 are measured only in the second measurement orientation. For example, in one embodiment of the present disclosure, approximately 10% of FMSs 162 on SDW 150 are measured both while SDW 150 is in the first measurement orientation and while SDW 150 is in the second measurement orientation, and the remaining approximately 90% of FMSs 162 on SDW 150 are measured only while SDW 150 is in the first measurement orientation. In this exemplary embodiment, approximately 10% of SMSs 164 on SDW 150 are also measured both while SDW 150 is in the first measurement orientation and while SDW 150 is in the second measurement orientation, and the remaining approximately 90% of SMSs 164 on SDW 150 are measured only while SDW 150 is in the second measurement orientation.

Metrology tool 120 can further include at least one optical module 180, which generates incident radiation 182 for use in measuring features 152 formed within each of FMS 162 and SMS 164. It is appreciated that metrology tool 120 can generate a first measurement-orientation quality parameter dataset (FMQPD) from measurement of each FMS 162 in the first measurement orientation. Similarly, metrology tool 120 can generate a second measurement-orientation quality parameter dataset (SMQPD) from measurement of each SMS 164 in the second measurement orientation.

As described hereinbelow with reference to FIGS. 3 & 4, QPA 130 can receive the FMQPD and the SMQPD and, generates at least one TIS-ameliorated quality parameter value (TAQPV), at least partially based thereon. The TAQPV may be related to any suitable parameter, such as, inter alia, a misregistration between at least first layer 166 and second layer 168; a dimension, such as $D_1$ or $D_2$, of at least one of features 152 in FMS 162 and SMS 164; a dimension, such as $D_3$, $D_4$ or $D_5$, of at least one of spaces 154 between features 152 in FMS 162 and 164; a shape of at least one of features 152 in FMS 162 and SMS 164; and a shape of one of spaces 154 between features 152 in FMS 162 and SMS 164.

In one embodiment of the present disclosure, the TAQPV characterizes and is associated with a single FMS 162 or SMS 164. In an additional embodiment of the present disclosure, the TAQPV characterizes and is associated with a single MMS 160. In yet an additional embodiment of the present disclosure, the TAQPV characterizes and is associated with a group of MMSs 160, such as, inter alia, a group of MSSs 160 in a single column, row, field, or quadrant of SDW 150, a group of MSSs on a single SDW 150, and a group of MSSs on multiple SDWs 150.

Figure 3A:
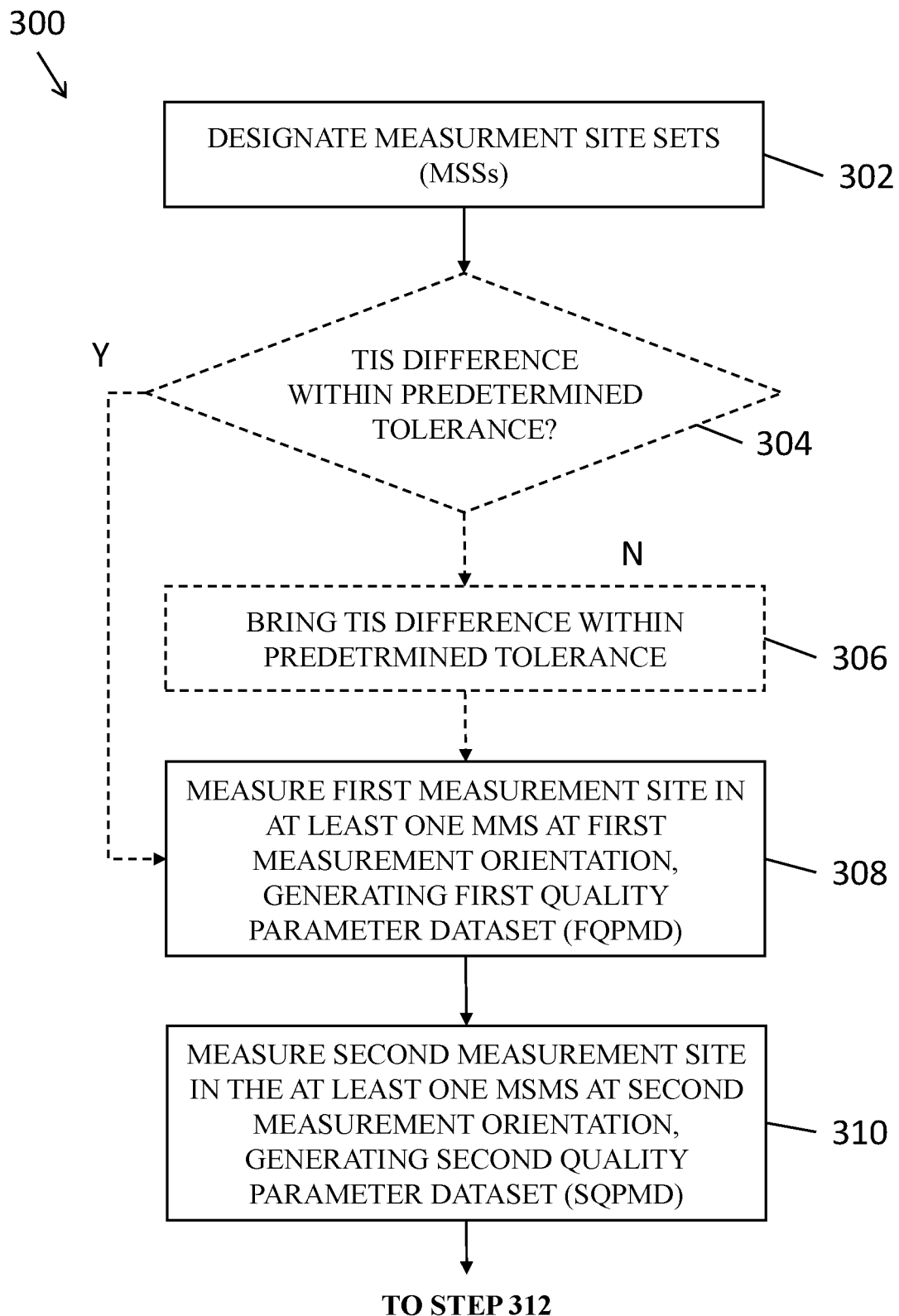
FIGS. 3A & 3B are together a simplified flowchart illustrating an embodiment of a method for use with the system of FIGS. 1 & 2.
Figure 3B:
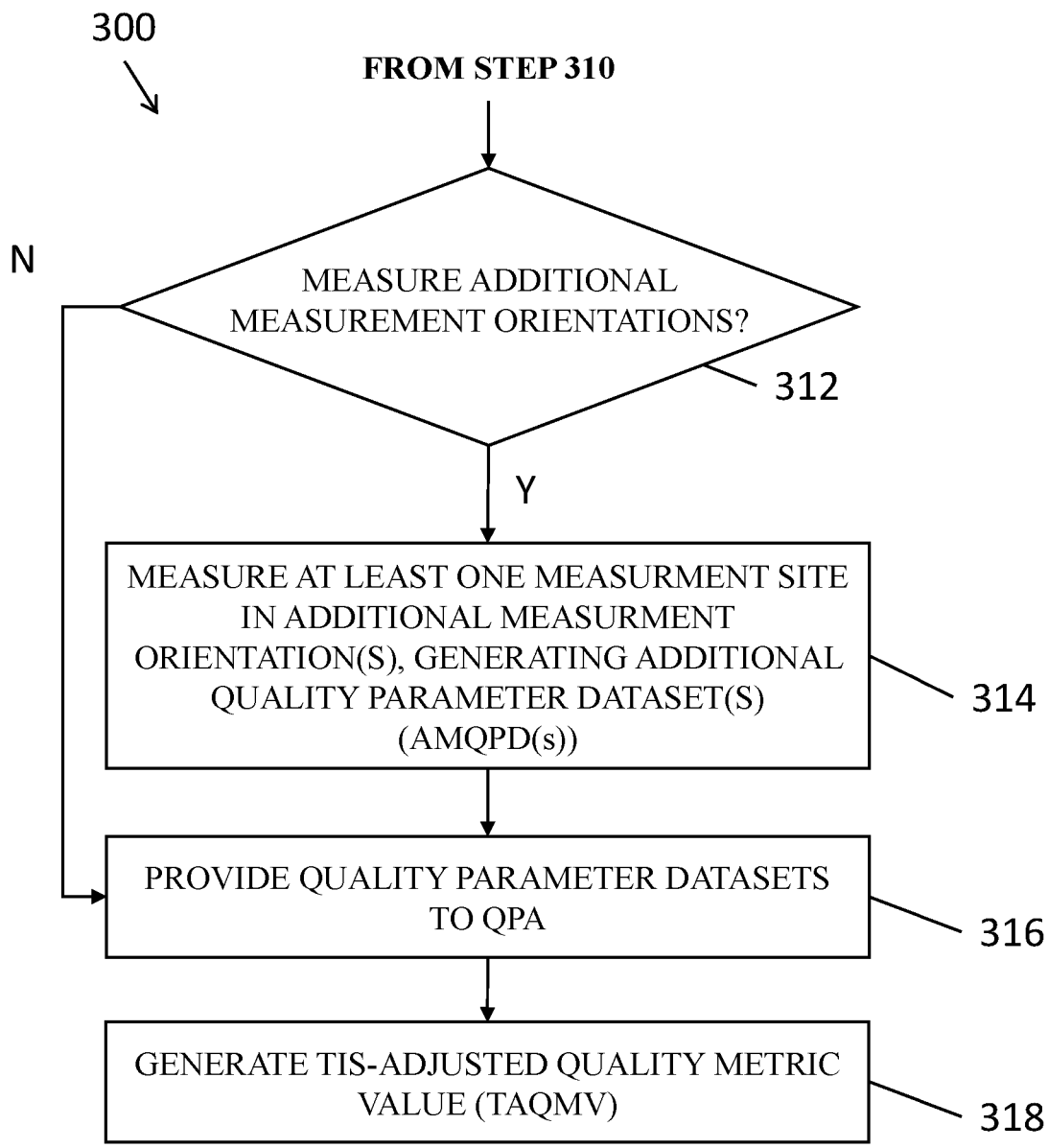
Figure 4A:
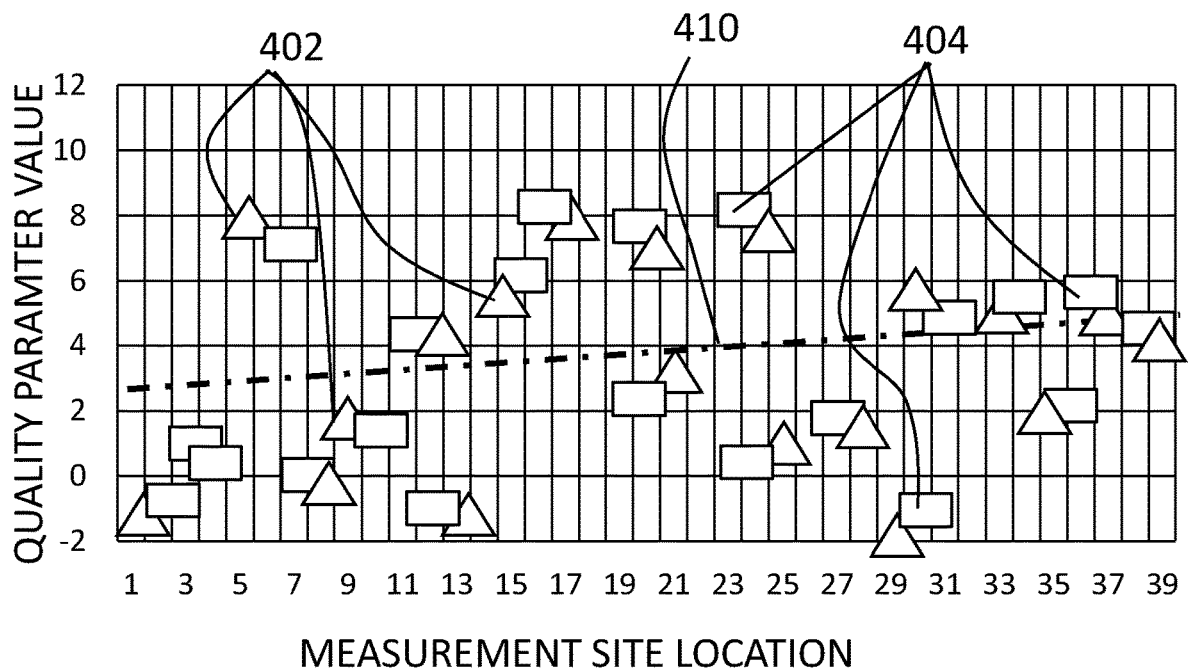
FIG. 4A is a simplified plot illustrating a prior art method of generating a TIS-adjusted quality parameter value.
Figure 4B:
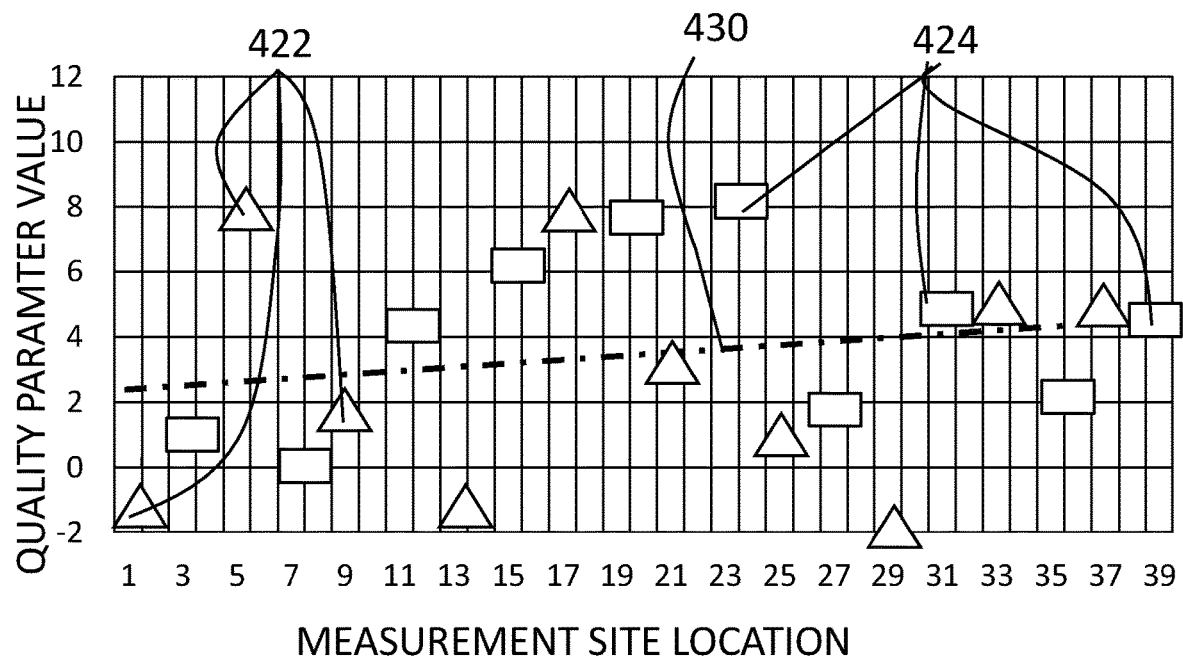
FIG. 4B is simplified plot illustrating a portion of the method of FIGS. 3A & 3B.

Reference is now made to FIGS. 3A & 3B, which, taken together, are a simplified flowchart illustrating an embodiment of a method 300 for use with system 100 of FIGS. 1 & 2, to FIG. 4A, which is a simplified plot illustrating a prior art method of generating a TIS-adjusted quality parameter value, and to FIG. 4B, which is simplified plot illustrating a portion of method 300 of FIGS. 3A & 3B. It is appreciated that method 300 can be performed as part of a larger fabrication process, after formation of at least one, and more typically of at least two, layers on SDW 150. Moreover, data generated as part of method 300 can be used to adjust fabrication parameters of the fabrication process of which method 300 forms a part.

As seen in FIG. 3A, at a first step 302, a plurality of MSSs 160 on a sample, such as SDW 150, are designated, such as by MSSD 110. As described hereinabove with reference to FIGS. 1 & 2, each of MSSs 160 can include at least a single FMS 162 and a single SMS 164. In some embodiments of the present disclosure, each MSS 160 includes at least one additional measurement-orientation site. Also, as described hereinabove, FMS 162 and SMS 164 are different measurement sites on SDW 150, and thus measurements of each of FMS 162 and SMS 164 measure different ones of features 152.

It is appreciated that method 300 is particularly suitable for use with MSSs 160 wherein a difference between a TIS associated with a FMQPD from a measurement of FMS 162 and a TIS associated with an SMQPD from a measurement of SMS 164 is within a predetermined tolerance. Therefore, at an optional next step 304, the TIS associated with measurements of FMSs 162 and SMSs 164 of each MSS 160 on SDW 150 is evaluated, for example, by performing a TIS-on-Link protocol similar to the one described in Boaz Ophir, Udi Shusterman, Anna Golotsvan, Cindy Kato, Masanobu Hayashi, Richika Kato, Tomohiro Goto, Taketo Kuriyama, Manabu Miyake, Yasuki Takeuchi, Hiroyuki Mizuochi, "Machine learning for Tool Induced Shift (TIS) reduction: an HVM case study," Proc. SPIE 11611, Metrology, Inspection, and Process Control for Semiconductor Manufacturing XXXV, 116110E (22 Feb. 2021).

If results of the evaluation of step 304 indicate that a difference between a TIS associated with a FMQPD from a measurement of FMS 162 and a TIS associated with an SMQPD from a measurement of SMS 164 is not within the predetermined tolerance, the difference can be brought to within the predetermined tolerance at a next step 306. Step 306 may be performed by adjusting fabrication parameters of SDW 150 or by adjusting measurement parameters used in method 300.

Following step 306, or, if results of the evaluation of step 304 indicate that a difference between a TIS associated with a FMQPD from a measurement of FMS 162 and a TIS associated with an SMQPD from a measurement of SMS 164 is within the predetermined tolerance, then following step 304, or, if step 304 is not performed, then following step 302, method 300 proceeds to a next step 308. At step 308, at least one FMQPD is generated by measuring features 152 formed within each FMS 162 of at least one of the MSSs 160 in a first measurement orientation. As described hereinabove with reference to FIGS. 1 & 2, as used herein, "orientation" refers to the rotational orientation of SDW 150 within a plane generally parallel to upper surface 158 of SDW 150. The measurement or measurements taken at step 308 can be measured using metrology tool 120.

At a next step 310, at least one SMQPD is generated by measuring, for each MSS 160 measured at step 308, features 152 formed within each SMS 164 in a second measurement orientation. As described hereinabove with reference to FIGS. 1 & 2, the first and second measurement orientations of respective steps 308 and 310 may have any suitable values which are different from one another, most typically 0° and 180°, respectively.

As seen particularly in FIG. 3B, at a next step 312, a determination is made whether or not to measure measurement sites at additional measurement orientations. If additional measurements at additional measurement orientations are to be taken, method 300 proceeds to a next step 314.

At step 314, in an embodiment wherein MSS 160 includes at least one additional measurement-orientation site, each additional measurement-orientation site is measured at a corresponding measurement orientation thereof, thereby generating an additional measurement-orientation quality parameter dataset (AMQPD) for each additional measurement taken at step 314.

By way of example only, if each MSS 160 includes four measurement sites, for each MSS 160, at step 308, FMS 162 may be measured at a rotational orientation of 0°, at step 310, SMS 164 may be measured at a rotational orientation of 180°, and at step 314, the two additional measurement-orientation sites may be measured at rotational orientations of 90° and 270°, respectively.

Additionally or alternatively, at step 314 at least one of FMS 162 and SMS 164 may be measured at an orientation different than the orientation at which the FMS 162 or SMS 164 was measured at respective step 308 or 310. For example, as described hereinabove, in one embodiment of the present disclosure, approximately 10% of FMSs 162 and SMSs 164 on SDW 150 are measured both while SDW 150 is in the first measurement orientation and while SDW 150 is in the second measurement orientation, and the remaining approximately 90% of FMSs 162 on SDW 150 are measured only while SDW 150 is in the first measurement orientation and the remaining approximately 90% of SMSs 164 on SDW 150 are measured only while SDW 150 is in the second measurement orientation. In such an embodiment, at step 308, all FMSs 162 are measured in the first measurement orientation, at step 310, all SMSs 164 are measured in the second measurement orientation, and at step 314, approximately 10% of FMSs 162 are measured in the second measurement orientation and approximately 10% of SMSs 164 are measured in the first measurement orientation.

It is appreciated that although for ease of understanding, steps 312 and 314 are shown as being performed after both of steps 308 and 310, in an embodiment wherein some FMSs 162 are measured at the second measurement orientation and/or some SMSs 164 are measured at the first measurement orientation, step 314 can be performed together with steps 308 and 310. Thus, for each measurement orientation used in method 300, chuck 170 can move SDW 150 to that measurement orientation only once, and all measurements to be taken at that measurement orientation are taken while SDW is at that measurement orientation. Only after all measurement sites which are to be measured at that measurement orientation have been measured at that measurement orientation, does chuck 170 moves SDW 150 to a different measurement orientation.

Following step 314, or, if at step 312 a determination is made not to measure measurement sites at additional measurement orientations, then following step 312, method 300 proceeds to a next step 316. At step 316, FMQPDs generated at step 308 and SMQPDs generated at step 310, as well as AMQPDs generated at step 314, if any, are provided to QPA 130.

At a next step 318, QPA 130 can analyze the FMQPDs, SMQPDs and AMQPDs provided at step 316, and generates at least one tool-induced-shift (TIS)-ameliorated quality parameter value (TAQPV), at least partially based thereon. As described hereinabove with reference to FIGS. 1 & 2, the TAQPV generated at step 318 may be any suitable TAQPV, such as, inter alia, a misregistration between at least first layer 166 and second layer 168; a dimension, such as $D_1$ or $D_2$, of at least one of features 152 in FMS 162 and SMS 164; a dimension, such as $D_3$, $D_4$ or $D_5$, of at least one of spaces 154 between features 152 in FMS 162 and 164; a shape of at least one of features 152 in FMS 162 and SMS 164; and a shape of one of spaces 154 between features 152 in FMS 162 and SMS 164.

Also as described hereinabove with reference to FIGS. 1 & 2, in one embodiment of the present disclosure, the TAQPV characterizes and is associated with a single FMS 162 or SMS 164. In an additional embodiment of the present disclosure, the TAQPV characterizes and is associated with a single MMS 160. In yet another embodiment of the present disclosure, the TAQPV characterizes and is associated with a group of MMSs 160, such as, inter alia, a group of MSSs 160 in a single column, row, field, or quadrant of SDW 150, a group of MSSs on a single SDW 150, and a group of MSSs on multiple SDWs 150.

In an embodiment of the present disclosure, the analysis performed at step 318 can include fitting the FMQPDs, SMQPDs and AMQPDs provided at step 316 to a model. Such a model may be any suitable model, such as, inter alia, an arithmetic mean, a linear regression, or a higher-order model, such as a model similar to a model described in Dana Klein, Dania Negri, "Error modeling and accuracy breakdown in optical overlay metrology for advanced nodes," Proc. SPIE 11613, Optical Microlithography XXXIV, 116130X (22 Feb. 2021).

It is particular feature of the present disclosure that at step 318, the analysis by QPA 130 of the FMQPDs, SMQPDs and AMQPDs can automatically remove at least some components of a quality parameter which are due mostly or only due to TIS, thereby allowing QPA 130 to provide a TAQPV.

As seen in FIG. 4A, a prior art method measures each of a multiplicity of measurement sites at both a first measurement orientation, as indicated by each of triangular markers 402, and a second measurement orientation, as indicated by each of rectangular markers 404. The prior art method then fits data generated by the measurements to a straight-line model using a linear regression, generating a quality parameter value for each measurement site, as indicated by a dashed trend line 410. Since each measurement site is measured at two different measurement orientations, the TIS error for each site cancels when the data is fit to a suitable model.

In contrast, as seen in FIG. 4B, method 300 measures most or all FMSs 162 at only a first measurement orientation at step 308, as indicated by each of triangular markers 422, and measures most or all SMSs 164 at only a second measurement orientation at step 310, as indicated by each of rectangular markers 424. Method 300 then fits data generated by the measurements of steps 308 and 310 to a model, shown in FIG. 4B as a straight-line model fit with a linear regression, thereby generating the TAQPV for each measurement site, as indicated by a dashed trend line 430.

As indicated by the number of markers 422 and 424 in FIG. 4B as compared to the number of markers 402 and 404 in FIG. 4A, method 300 generates approximately half as many measurements as are required by the prior art method illustrated in FIG. 4A. Additionally, as indicated by the relative positions of trend lines 410 and 430, method 300 generates TAQPVs within a predetermined tolerance of quality parameter values generated by the prior art method illustrated in FIG. 4A.

It will be appreciated by persons skilled in the art that the present disclosure is not limited to what has been particularly shown and described hereinabove. The scope of the present disclosure includes both combinations and subcombinations of various features described hereinabove as well as modifications thereof, all of which are not in the prior art.

The invention claimed is:

1. A method of generating a quality parameter value of a semiconductor device wafer (SDW), during fabrication thereof, the method comprising:

designating a plurality of measurement site sets (MSSs) on said SDW, each of said MSSs comprising a first measurement-orientation site (FMS) and a second measurement-orientation site (SMS), said FMS and said SMS being different measurement sites on said SDW;

measuring features formed within each FMS of at least one of said MSSs in a first measurement orientation using incident radiation to generate a first measurement-orientation quality parameter dataset (FMQPD);

measuring features formed within each said SMS of said at least one of said MSSs in a second measurement orientation using said incident radiation to generate a second measurement-orientation quality parameter dataset (SMQPD); and generating at least one tool-induced-shift (TIS)-ameliorated quality parameter value (TAQPV), at least partially based on said FMQPD and said SMQPD.

2. The method according to claim 1, wherein said first measurement orientation and said second measurement orientation each comprise a rotational orientation within a plane generally parallel to an upper surface of said SDW.

3. The method according to claim 1, wherein:
said first measurement orientation comprises a rotational orientation of 0° within a plane generally parallel to an upper surface of said SDW; and
said second measurement orientation comprises a rotational orientation of 180° within said plane generally parallel to said upper surface of said SDW.

4. The method according to claim 1, wherein said quality parameter is a misregistration between at least a first layer formed on said SDW and a second layer formed on said SDW.

5. The method according to claim 1, wherein said quality parameter is a dimension of at least one of said features.

6. The method according to claim 1, wherein said quality parameter is a dimension of at least one space between said features.

7. The method according to claim 1, wherein each of said at least one TAQPV is associated with one of said FMSs or said SMSs.

8. The method according to claim 1, wherein each of said at least one TAQPV is associated with one of said MSSs.

9. The method according to claim 1, wherein each of said at least one TAQPV is associated with a group of said MSSs.

10. The method according to claim 1, further comprising using said TAQPV to adjust at least one parameter of said fabrication of said SDW.

11. The method according to claim 1, wherein said features formed within each said FMS of said at least one of said MSSs are intended to be identical to said features formed within each said SMS of said at least one of said MSSs.

12. The method according to claim 1, wherein said features formed within said FMS comprise a misregistration target and said features formed within said SMS comprise a misregistration target.

13. The method according to claim 1, wherein said features formed within said FMS comprise functional semiconductor devices and said features formed within said SMS comprise functional semiconductor devices.

14. The method according to claim 1, wherein generating said at least one TAQPV comprises fitting said FMQPD and said SMQPD to a model.

15. A system for generating a quality parameter value of a semiconductor device wafer (SDW), the system comprising:
a measurement site set designator (MSSD), operative to designate a plurality of measurement site sets (MSSs) on said SDW, each of said MSSs comprising a first measurement-orientation site (FMS), and a second-orientation measurement site (SMS), said FMS and said SMS being different measurement sites on said SDW;
a metrology tool that includes:
a chuck configured to support said SDW;
an optical module configured to generate incident radiation directed toward said SDW on said chuck,
wherein said metrology tool is operative to:
measure features formed within each said FMSs of each of said MSSs in a first measurement orientation using said incident radiation, thereby generating a first measurement-orientation quality parameter dataset (FMQPD); and
measure features formed within each said SMSs of each of said MSSs in a second measurement orientation using said incident radiation, thereby generating a second measurement-orientation quality parameter dataset (SMQPD); and
a quality parameter analyzer, operative to generate at least one tool-induced-shift (TIS)-ameliorated quality parameter value (TAQPV) at least partially based on said FMQPD and said SMQPD.

16. The system according to claim 15, wherein said first measurement orientation and said second measurement orientation each comprise a rotational orientation within a plane generally parallel to an upper surface of said SDW.

17. The system according to claim 15, wherein:
said first measurement orientation comprises a rotational orientation of 0° within a plane generally parallel to an upper surface of said SDW; and
said second measurement orientation comprises a rotational orientation of 180° within said plane generally parallel to said upper surface of said SDW.

18. The system according to claim 15, wherein said quality parameter is a misregistration between at least a first layer formed on said SDW and a second layer formed on said SDW, a dimension of at least one of said features, or a dimension of at least one space between said features.

19. The system according to claim 15, wherein each of said at least one TAQPV is associated with one of said FMSs or SMSs.

20. The system according to claim 15, wherein each of said at least one TAQPV is associated with a group of said MSSs.

21. The system according to claim 15, wherein said features formed within each said FMS of said at least one of said MSSs are intended to be identical to said features formed within each said SMS of said at least one of said MSSs.

22. The system according to claim 15, wherein said features formed within said FMS comprise a misregistration target and said features formed within said SMS comprise a misregistration target.

23. The system according to claim 15, wherein said features formed within said FMS comprise functional semiconductor devices and said features formed within said SMS comprise functional semiconductor devices.

24. The system according to claim 15, wherein said quality parameter analyzer is operative to fit said FMQPD and said SMQPD to a model, thereby generating said TAQPV.

* * * * *